United States Patent [19]

Di Nunzio et al.

[11] Patent Number: 5,017,874
[45] Date of Patent: May 21, 1991

[54] METHOD AND APPARATUS FOR DETECTING AND INDICATING ANOMALIES IN THE OPERATION OF THE IGNITION SYSTEMS OF INTERNAL COMBUSTION ENGINES

[75] Inventors: Vittorio Di Nunzio; Francesco D'Onofrio, both of Turin, Italy

[73] Assignee: Fiat Auto S.p.A., Turin, Italy

[21] Appl. No.: 141,755

[22] Filed: Jan. 11, 1988

[30] Foreign Application Priority Data

Jan. 9, 1987 [IT] Italy .............................. 67010 A/87

[51] Int. Cl.$^5$ ...................... F02P 17/00; G08B 21/00
[52] U.S. Cl. ................................... 324/378; 324/388; 324/390; 340/661
[58] Field of Search ............... 324/378, 379, 380, 388, 324/390, 402, 384, 393, 401, 399; 123/407, 410–412, 416; 73/115, 116; 364/558; 340/659, 661

[56] References Cited

U.S. PATENT DOCUMENTS

| | | | |
|---|---|---|---|
| 3,415,114 | 12/1968 | Crampton et al. | 324/402 X |
| 3,910,040 | 10/1975 | Garcea | 340/592 X |
| 4,503,479 | 3/1985 | Otsuka et al. | 340/66 X |
| 4,558,280 | 12/1985 | Koehl et al. | 324/399 |
| 4,634,971 | 1/1987 | Johnson et al. | 340/661 X |
| 4,648,367 | 3/1987 | Gillbrand et al. | 73/115 X |
| 4,760,341 | 7/1988 | Skerritt | 324/379 |
| 4,783,991 | 11/1988 | Wixon | 324/399 X |

*Primary Examiner*—Kenneth Wieder
*Assistant Examiner*—Jack B. Harvey
*Attorney, Agent, or Firm*—Sughrue, Mion, Zinn, Macpeak & Seas

[57] ABSTRACT

The method and apparatus allows the detection and indication of anomalies in the operation of the ignition system of an internal combustion engine including a plurality of spark plugs, each of which receives a periodic high-voltage pulse output by a high-voltage generator in operation. The method includes the steps of:
detecting the pulses generated by the high-voltage generator,
comparing the peak values of each pulse detected with first and second threshold values, and
producing a perceptible signal when the peak values of the high-voltage pulses fall outside the acceptable range defined between the threshold values.

1 Claim, 5 Drawing Sheets

METHOD AND APPARATUS FOR DETECTING AND INDICATING ANOMALIES IN THE OPERATION OF THE IGNITION SYSTEMS OF INTERNAL COMBUSTION ENGINES

The present invention relates to a method and device for detecting and indicating anomalies in the operation of the ignition systems of internal combustion engines, particularly (but not exclusively) for motor vehicles having catalytic silencers.

It is known that in certain environmental or climatic conditions, for example, during heavy atmospheric precipitation, the ignition systems of internal combustion engines may display operating difficulties or irregularities in running conditions or starting difficulties.

It is also possible for other conditions to occur which are not always clearly noticeable to the user, in which the generation of the spark by the spark plug does not occur correctly and the air-fuel mixture is not completely burnt. Such conditions occur, for example, when the electrodes of the spark plugs are excessively worn or when the plugs are dirty, for example, as a result of prolonged running of the motor vehicle in congested traffic.

Further causes of anomalies in operation of the ignition system may be constituted by false contacts of the cables on the low-voltage side of the system or partial loosening or incorrect insertion of terminals or connectors on the high-voltage side.

In general, such anomalies in operation of the ignition system are for the most part tolerated by the user, especially when they are intermittent. In fact, the user generally turns to a repairer only when the operating anomalies are recurrent and create an obvious problem.

There are, however, several situations in which such operating anomalies in the ignition system cause not only an unpleasant situation for the user but may cause irreparable economic harm. This is the case in motor vehicles with internal combustion engines provided with catalytic silencers for reducing the pollution caused by exhaust gases. It is in fact found that the operating anomalies or malfunctions of the ignition system may result in complete deterioration of the catalyst in the catalytic silencer in a relatively short time.

In order to avoid this disadvantage, indicating devices have been proposed which are arranged to indicate to the user the occurrence of conditions which are dangerous with regard to the integrity of the catalyst. Such known devices are based on the use of a temperature sensor mounted directly within the catalyst or immediately downstream thereof. Such devices have two types of disadvantage. The first is of an economic nature: the unit constituted by the sensor and the electronic circuitry needed to amplify and process the signal generated by the sensor involve a not inconsiderable cost. The second type of disadvantage is of a functional nature, in the sense that such devices do not always succeed in differentiating anomalous operating conditions from acceptable operating conditions with any certainty. Experience has in fact shown that some devices output an alarm signal in certain cases even when dangerous conditions do not in actually prevail, while effectively dangerous conditions are not always signalled.

A device for protecting the catalyst has also been designed and put into practice which includes two temperature sensors disposed one upstream and the other downstream of the catalyst in the path of the exhaust gas. This device, which outputs an alarm signal when the temperature difference indicated by the two sensors exceeds a predetermined threshold level, although being better than the previous devices, has the disadvantage, however, of being even more expensive than the simpler devices previously proposed.

The object of the present invention is to provide a method which is simple to carry out, very reliable, and extremely cheap to put into practice, and allows the identification and indication of operating anomalies in ignition systems for internal combustion engines of motor vehicles, such anomalies being in practice mainly responsible for damage to the catalyst in catalytic silencers.

This object is achieved according to the present invention by means of a method for detecting and indicating anomalies in the operation of the ignition system of an internal combustion engine, particularly for a motor vehicle having a catalytic silencer, the ignition system including a plurality of spark plugs, each of which receives a periodic high-voltage pulse from an output of high-voltage generator means to produce a spark, the method being characterised in that it includes the steps of:

detecting the voltage pulses generated by the generator means, comparing the peak values of each pulse detected with first and second predetermined threshold values, and producing a perceptible signal when the peak values of the high-voltage pulses fall outside the range defined between the threshold values.

According to another characteristic, in the method of the invention, the vacuum in the induction manifold of the engine is also detected (directly or indirectly) and the first and second threshold values are varied in a predetermined manner in dependence on the value of the vacuum in the induction manifold.

The invention also relates to apparatus for the detection and indication of operating anomalies in ignition systems for internal combustion engines by carrying out the method.

Further characteristics and advantages of the invention will become apparent from the detailed description which follows with reference to the appended drawings, provided purely by way of non-limiting example, in which.

Figures 1, 2:
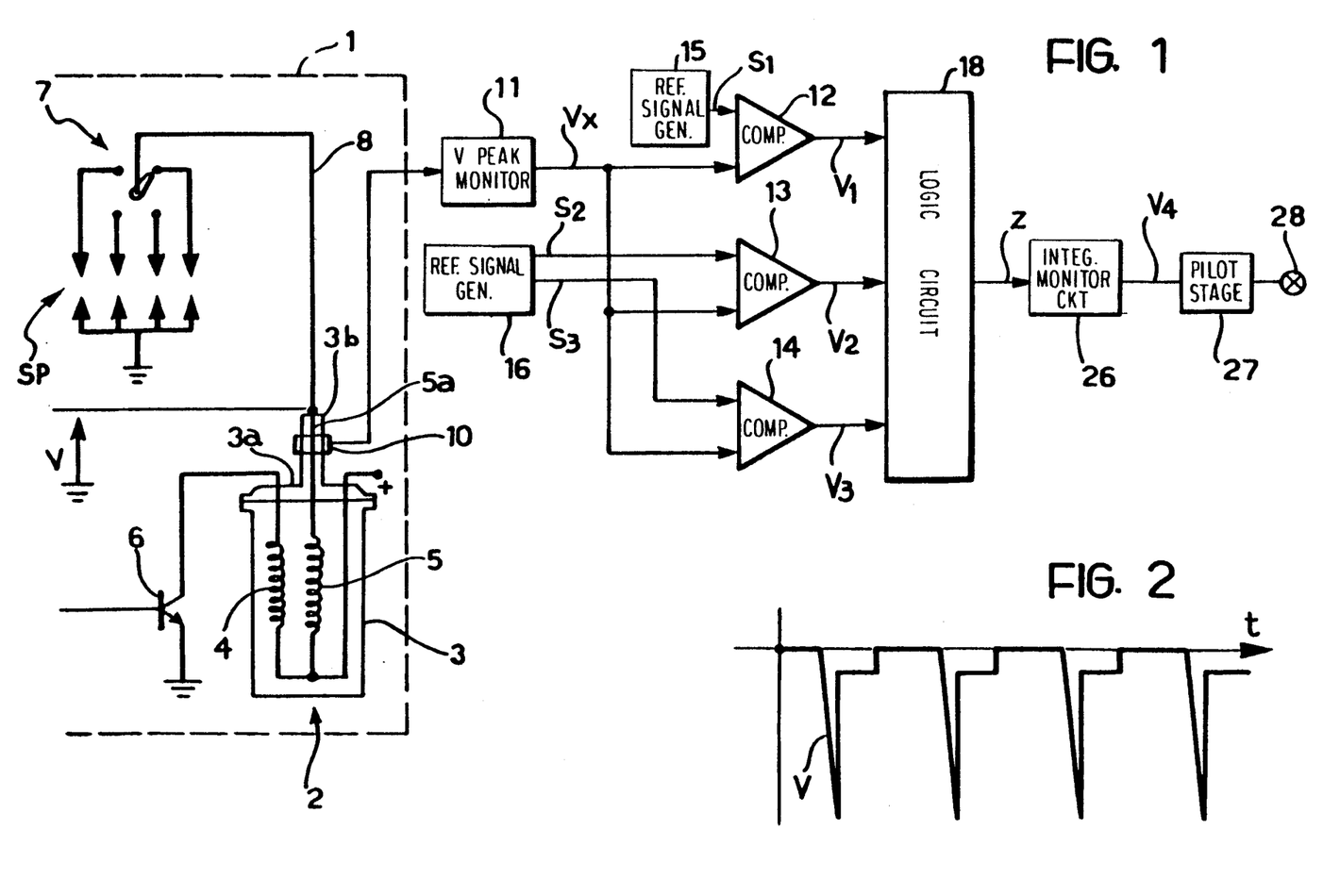
FIG. 1 is a block schematic electrical diagram of apparatus according to the present invention.
FIG. 2 is a graph illustrating the waveform of the high voltage generated in an ignition system for generating the sparks in the spark plugs.

In FIG. 1 a motor vehicle ignition system is generally indicated 1. In the embodiment illustrated, the system includes an ignition transformer or coil 2 housed in a casing 3 and including a primary or low-tension winding 4 and a secondary or high-tension winding 5. The primary winding 4 is connected to the commutator of a pilot transistor 6 the base of which is supplied in known manner with command pulses at a frequency linked to the rate of rotation of the engine. The casing 3 has an upper cover 3a with a central, substantially frusto-conical appendage 3b into which extends one end of the high-tension winding 5. This end of the winding 5 is connected to an ignition distributor 7 through a high-tension cable 8. In known manner, the ignition distributor 7 distributes high-voltage pulses to the spark plugs SP in the engine in operation.

FIG. 2 shows the typical changes in the voltage V output by the ignition transformer or coil 2 as a function of the time t. The voltage V has peaks with a frequency proportional to the rate of rotation of the engine. These peaks reach levels of the order of tens of kilovolts.

The present invention is based on the fact that the value of the voltage peaks V represents a useful indication for inferring whether the igniton system is functioning correctly or not. When one or more spark plugs is dirty or there is a loss of current between the ignition coil 2 and the plugs, there is no longer a good discharge and this can be inferred from an analysis of the waveform of the voltage V. In particular, in the case of loss of current or dirty spark plugs, the amplitude of the voltage peaks V may be reduced to below the voltage necessary to produce the spark in the combustion chamber. There is thus a loss of sparking and the engine then misses.

Other types of operating anomalies which involve an increase in the value of the peak voltage between the output of the ignition coil 2 and earth may also occur in the ignition system. This may occur, for example, when the high-tension cable 8 (or in general a high-tension cable connecting a high-voltage source to the spark plugs) is not correctly connected: in this case, the voltge V assumes the value of the no-load output voltage of the transformer 4, 5, which is considerably higher than the peak voltage normally applied to the spark plugs.

From what has been explained above it can be inferred that, when the ignition system operates correctly, the peak voltage value V is between a minimum value and a maximum value.

With reference to FIG. 1, apparatus according to the present invention includes a signal pick-up member 10 constituted by an element of electrically conductive material having, for example, an annular shape and fitted onto the appendage 3b of the ignition coil 2. The ring 10 is coupled to an end portion 5a of the secondary winding 5 in a capacitive coupling relationship. In other words, the ring 10 constitutes one plate of a capacitor, the other plate of which is constituted by the terminal 5a of the ignition coil.

Figure 3:
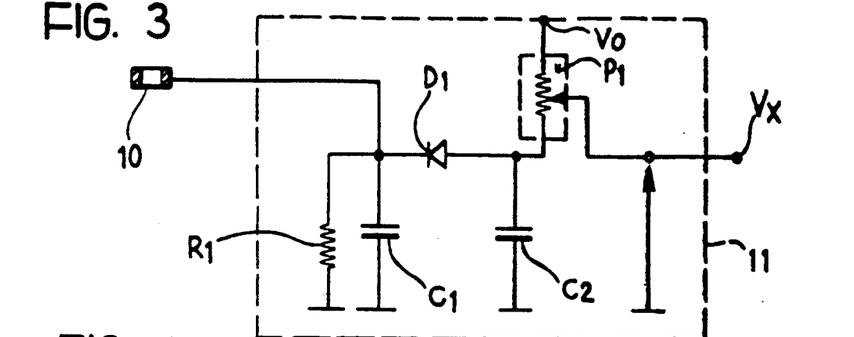
FIGS. 3 to 10 are detailed electrical diagrams of embodiments of parts of the apparatus according to the invention shown in FIG. 1.

The ring 10 is connected to a circuit 11 for monitoring the peaks in the voltage V. FIG. 3 illustrates one embodiment in which the circuit 11 comprises a capacitor $C_1$ and a resistor $R_1$ connected together in parallel between the ring 10 and earth, and a diode $D_1$ having its cathode connected to the ring 10 and its anode connected to a capacitor $C_2$ connected to earth. Between the unearthed terminal $C_2$ and the output of the circuit 11 is a regulating potentiometer $P_1$ having its resistive element connected between the capacitor $C_2$ and a stabilised voltage supply $V_0$ (not illustrated). The slider of the potentiometer $P_1$ constitutes the output of the circuit 11.

In the embodiment illustrated in FIG. 3, the capacitors $C_1$, $C_2$, together with the capacitor constituted by the ring 10 and the terminal of the ignition coil, form a capacitive voltage divider. The circuit 11 thus outputs a signal $V_x$, the changes in which are shown in the first graph of FIG. 12. The signal $V_x$ has a pulse in correspondence with each pulse of the voltage V. The diode $D_1$ of the circuit 11 has the function of extending the pulses $V_x$ relative to the pulses V without altering their frequency and without modifying their peak value. The object of this is to render the signal $V_x$ suitable for subsequent processing. The trimmer $P_1$ allows the range of variation of the signal $V_x$ to be calibrated.

Figure 4:
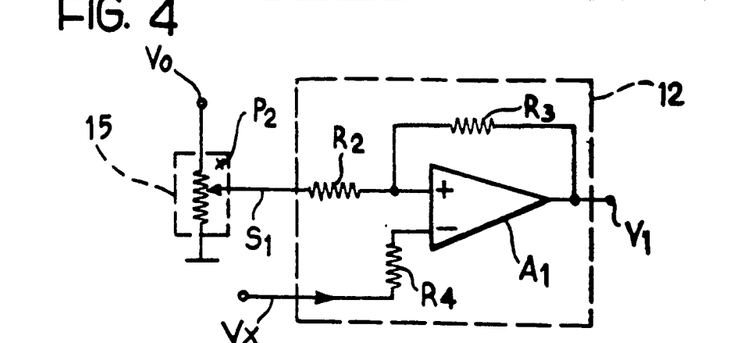
Figure 5:
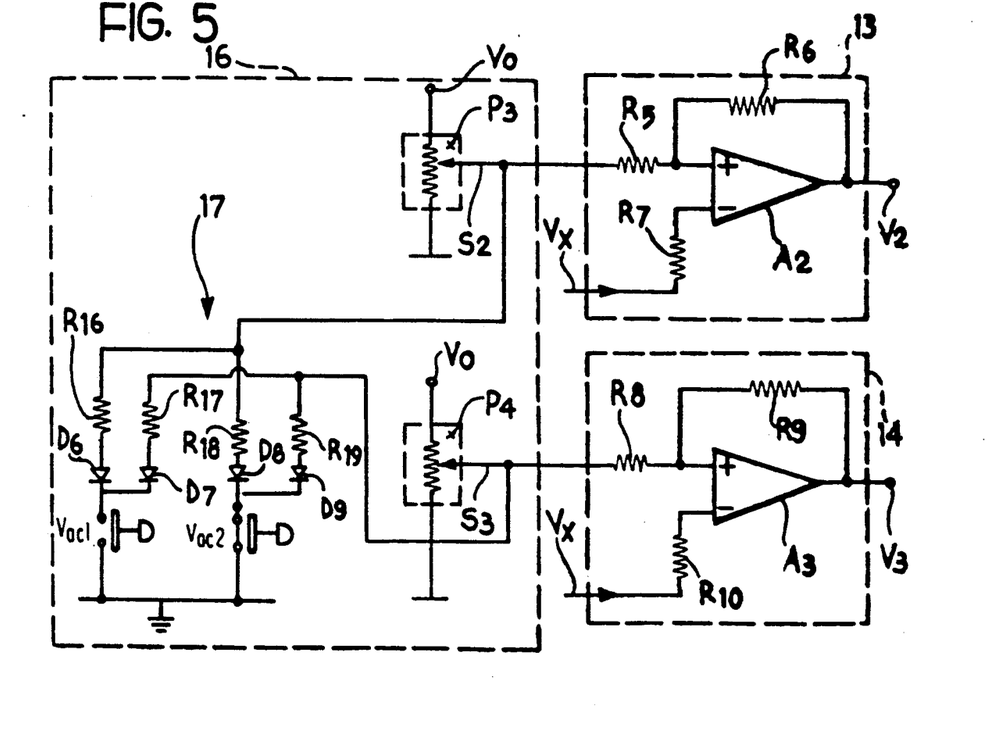

The output of the circuit 11 is connected to three threshold comparators with hysteresis, indicated 12 to 14 in FIG. 1 and illustrated in greater detail in FIGS. 4 and 5. As seen from FIG. 4, the comparator 12 in the embodiment illustrated is of the inverting type and includes an operational amplifier $A_1$ and three resistors $R_2$, $R_3$ and $R_4$. The non-inverting input of $A_1$ is connected through the resistor $R_2$ to a reference signal generator 15 constituted by a potentiometer $P_2$ connected between the voltage supply $V_0$ and earth. A threshold level $S_1$ (see the first graph of FIG. 12) is defined by the potentiometer and is so low as to be exceeded by all the peaks $V_x$. Consequently, the comparator 12 outputs a signal $V_1$ which has a pulse for each peak $V_x$.

The threshold comparators 13 and 14 have structures similar to that of the comparator 12 and, as shown in FIG. 5, in the embodiment illustrated they include respective operational amplifiers $A_2$ and $A_3$ and respective resistors $R_5$, $R_6$, $R_7$ and $R_8$, $R_9$ and $R_{10}$.

The non-inverting inputs of $A_2$ and $A_3$ are connected through the resistors $R_5$ and $R_8$ to respective outputs of a reference signal generator circuit, generally indicated 16. One embodiment of this circuit is illustrated in detail in FIG. 5. This circuit is intended to generate two reference signals $S_2$ and $S_3$ at a level in any case higher than that of the threshold level S associated with the comparator 12. For this purpose, the circuit 16 in the embodiment illustrated in FIG. 5 includes two potentiometers $P_3$ and $P_4$. circuit 16 also includes a circuit part, generally indicated 17 in FIG. 5, connected to the slides of the potentiometers $P_3$ and $P_4$, and arranged (in the manner and for reasons which will be described below) to modify the levels of the reference signals $S_2$ and $S_3$ upon variations of the operating conditions.

The values of the resistances $R_5$, $R_6$ and $R_8$, $R_9$ are selected so that the hysteresis curves of the comparators 13 and 14 are such that the signals $V_2$ and $V_3$ output by them have pulses with a duration at least equal to the duration of the pulses of the signal $V_1$ emitted by the comparator 12.

The threshold levels $S_2$ and $S_3$ with which the signal $V_x$ is compared in the comparators 13 and 14 correspond to the minimum and maximum values which define the range of acceptability for the peak value of the voltage V. Hence, when the peaks $V_x$ fall in the range between $S_2$ and $S_3$ (FIG. 12), the ignition system is operating correctly. Operating anomalies occur, however, when the peaks of $V_x$ have an amplitude less than $S_2$ or greater than $S_3$.

As stated above, the spark normally occurs if the voltage applied to the spark plug has a peak value within the range of acceptability defined between a minimum value and a maximum value. However, these minimum and maximum values are not constant and unchangeable upon variations in the operating conditions of the engine. In effect, the voltage necessary to produce the spark is a decreasing function of the vacuum in the induction manifold of the engine. In other words, in changing from high vacuum $\Delta P$ (for example, when the engine is idling) to almost a zero vacuum (for example, when the throttle valve is completely open), the voltage needed to cause the spark is greater. This is due to the fact that, as the pressure increases at the end of the compression phase, the discharge voltage increases. Typically, for an induction engine, the discharge voltage changes from 8–12 kV when the engine is idling to 12–18 kV when the throttle valve is completely open.

In view of the above, it is necessary for the levels of the reference signals provided by the circuit 16 to the comparators 13 and 14 not to be constant but to vary in dependence on the load of the engine.

If the engine has an electronic injection system, for example, of the so-called "speed-density" type, an electronic ignition system of the mapped type, or a system for controlling the fuel supply which can output a signal indicative of the load on the engine (for example, a signal indicative of the duration of the injection), the information relating to the vacuum in the induction manifold is already available. In such a case, it is not necessary to provide pressure sensors to supply the circuit 16 with the information relating to the vacuum in the induction manifold in order to vary the levels of the reference signals $S_2$ and $S_3$ correspondingly.

When the engine does not have these systems, however, a solution of the type shown by way of example in FIG. 5 may conveniently be adopted. In this solution, two switches $V_{ac1}$ and $V_{ac2}$ are interposed between the sliders of the potentiometers $P_3$ and $P_4$ and earth and are connected to two vacuostats or vacuum sensors (not illustrated) disposed in the induction manifold of the engine and calibrated so that they close respectively at first and second vacuum values, $\Delta p_1$ and $\Delta p_2$, for example, equal to 150 mm of Hg 300 mm of Hg.

A resistor $R_{16}$ and a diode $D_6$ and a resistor $R_{18}$ and a diode $D_8$ are interposed in series with each other between the slider of $P_3$ and the switches $V_{ac1}$ and $V_{ac2}$, respectively.

A resistor $R_{17}$ and a diode $D_7$ in series with each other and a resistor $R_{19}$ and a diode $D_9$, also in series with each other, are interposed between the slider $D_4$ and the aforesaid switches, respectively.

Figure 11:
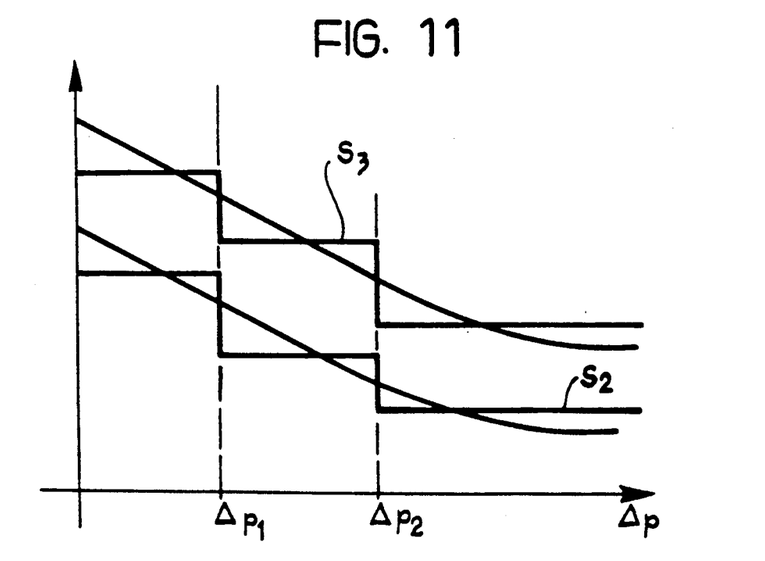
FIG. 11 is a graph showing the changes in the reference voltages generated in the apparatus of FIG. 1 upon variations of the vacuum in the induction manifold of the engine, given on the abscissa of the graph.

The switches $V_{ac1}$ and $V_{ac2}$ close when the vacuum in the induction manifold assumes two predetermined values indicated $\Delta p_1$ and $\Delta p_2$ in FIG. 11. By a suitable choice of the resistances of the resistors $R_{16}$ to $R_{19}$, the circuit part 17 can cause a stepwise variation in the reference signals $S_2$ and $S_3$, in the manner illustrated in FIG. 11, upon a variation of the vacuum in the induction manifold of the engine. This allows the signal $V_x$ to be compared in the comparators 13 and 14 with the increasing threshold levels upon a decrease of the vacuum in the manifold. This corresponds to a comparison of the peak voltage of the high voltage V with reference levels which also increase upon a decrease of the vacuum in the manifold.

If more than two vacuostats or pressure sensors are used, it is possible to vary $S_3$ and $S_2$ with a greater number of steps, increasing the precision of the operation of the entire apparatus.

As shown from FIG. 1, the outputs of the comparators 12 to 14 are connected to respective inputs of a logic circuit 18 arranged so as to output a signal Z which, as will be more fully described below, is kept at a low level when the peaks of $V_x$ are between the reference levels $S_2$ and $S_3$ but has a pulse in correspondence with each peak of $V_x$ of an amplitude less than $S_2$ or greater than $S_3$.

Figures 6, 7:
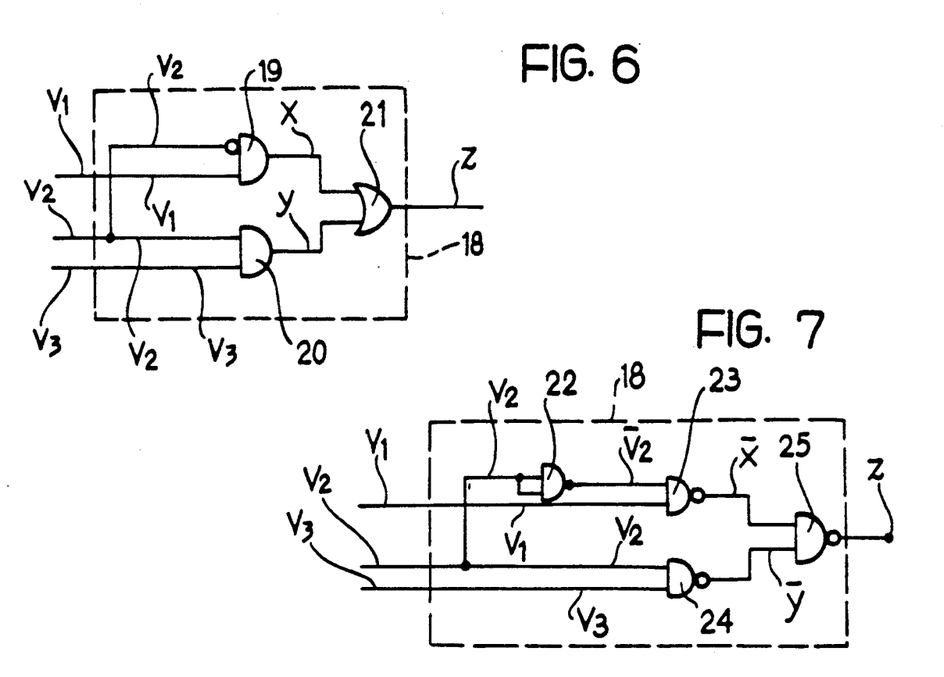

FIGS. 6 and 7 illustrate two possible embodiments of the logic circuits 18. In the example of FIG. 6, the circuit 18 includes two AND gates 19 and 20 whose outputs are connected to the inputs of an OR gate 21. The output of the latter represents the output of the entire logic circuit.

The gate 19 has a non-inverting input connected to the output of the comparator 12 and an inverting input connected to the output of the comparator 13. The gate 20 has its input connected to the outputs of the comparators 13 and 14.

The logic circuit 18 of FIG. 6 realises the Boolean equation:

$$Z=\overline{\overline{X}+\overline{Y}}$$

where $X=V_1 \cdot \overline{V}_2$ and $Y=V_2 \cdot V_3$ and represent the outputs of the gates 19 and 20.

The circuit 18 may conveniently be made with four gates 22 to 25 all of the NAND type, in the manner illustrated in FIG. 7. The circuit illustrated in this figure realises the Boolean function:

$$Z=X \cdot Y$$

which is equivalent to the previous one.

As can easily be seen from the Boolean equations given above, the signal Z output by the logic circuit 18 is kept at a level 0 as long as the peaks of $V_x$ are between the levels $S_2$ and $S_3$, and hence as long as the peaks of the high voltage V fall within the predefined acceptable range.

Immediately the peak values of the pulses $V_x$ fall below $S_2$ or rise above $S_3$, the signal Z has high-level pulses each of which corresponds to a peak of $V_x$.

Figure 8:
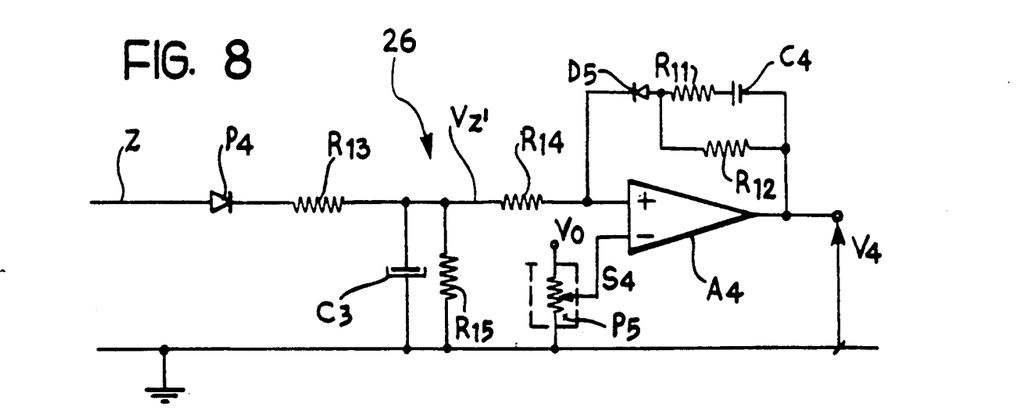

The logic circuit 18 is connected to an integrated monitoring circuit, generally indicated 26 in FIG. 1. FIG. 8 illustrates one embodiment in which the circuit 26 includes an operational amplifier $A_4$ the non-inverting input of which is connected to the output of the logic circuit 18 through a diode $D_4$ and two resistors $R_{13}$ and $R_{14}$. Between earth and the terminal common to $R_{13}$ and $R_{14}$ are connected a capacitor $C_3$ and a resistor $R_{15}$.

The inverting input of $A_4$ is connected to a potentiometer $P_5$ interposed between the stabilised voltage supply $V_0$ and earth.

Between the output of $A_4$ and its non-inverting input is connected a network constituted by a capacitor $C_4$, a resistor $R_{11}$ and a diode $D_5$. A resistor $R_{12}$ is connected in parallel with the group $R_{11}$–$C_4$. As will become more apparent below, the circuit 26 has the object of activating an indicator device only when the signal Z effectively presents a series of successive pulses, rendering the device according to the invention practically insensitive to disturbances. The circuit 26 integrates the pulses of the signal Z and, when the result of this integration exceeds a threshold level established by means of the potentiometer $P_5$, the signal $V_4$ output by $A_4$ switches level, changing to a high level and activating an indicator lamp 28 through a pilot stage 27. The indicator lamp is conveniently mounted on the instrument panel of the motor vehicle.

The feedback network formed by $D_5$, $R_{11}$, $C_4$ and $R_{12}$ has the function of achieving timing hysteresis by virtue of which the output of $A_4$ remains at the high level for a predetermined time (for example, several seconds) even after the signalled anomaly has disappeared. Naturally, if an operating anomaly in the ignition system remains indefinitely (and hence the signal Z presents pulses which follow each other indefinitely) the output signal $V_4$ of $A_4$ also remains indefinitely at a high level, causing the permanent activation of the lamp 28.

Figure 9:
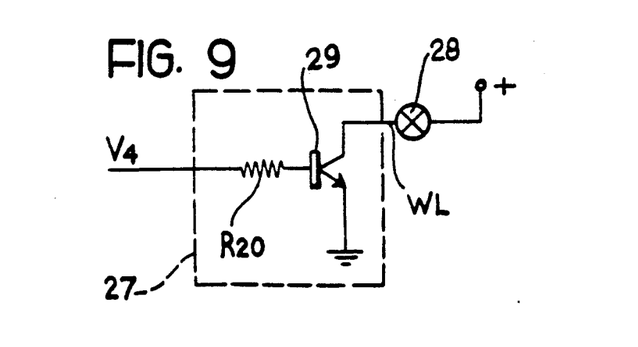

As seen from FIG. 9, the pilot stage 27 may simply include a transistor 29 having its base connected to the output of $A_4$ through a resistor $R_{20}$ and having a collector-emitter path in series with the lamp 28 between a voltage supply and earth.

Figure 12:
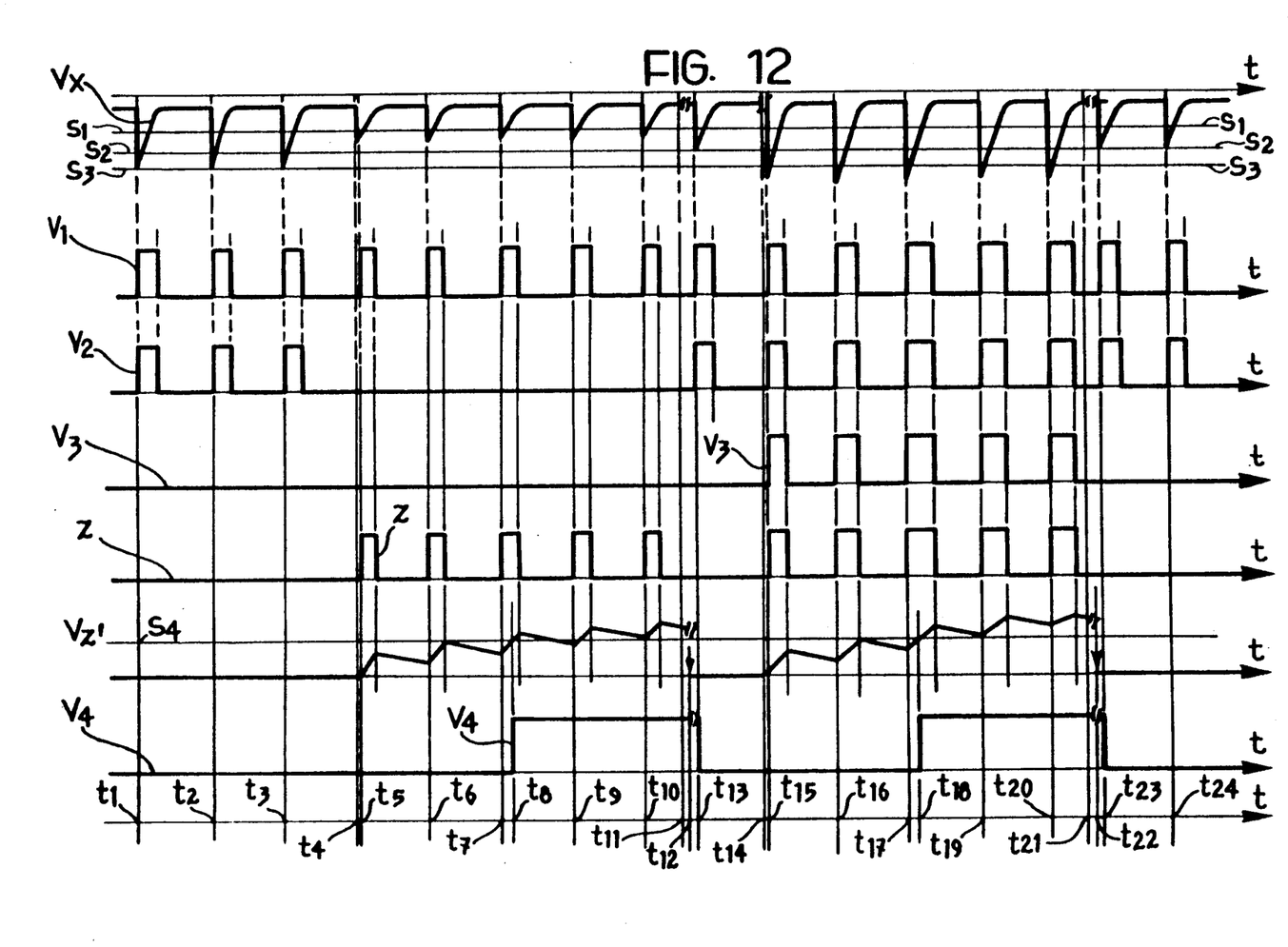
FIG. 12 shows a series of graphs illustrating the waveforms of a plurality of signals generated in the apparatus according to the invention, as a function of the time t given on the abscissa.

The manner of operation of the device described above will now be summarised with reference to the graphs of FIG. 12 which show the waveforms of the more important signals generated in the circuit described above by way of example.

The first graph of FIG. 12 shows the course of the signal $V_x$ output by the circuit 11 of FIG. 1. In this graph, the threshold $S_1$, $S_2$ and $S_3$, the meanings of which have already been fully discussed previously, are also shown.

The signal $V_x$ has a peak for each spark generated in the ignition system. The first three pulses shown in FIG. 12, at the instants $t_1$, $t_2$ and $t_3$ respectively, represent a sequence of regular operation of the ignition system. In fact, it may be noted that these three pulses have a peak amplitude which exceeds the threshold $S_2$ but not the threshold $S_3$. In these conditions, the signals $V_1$ and $V_2$ supplied by the comparators 12 and 13 have a pulse for each peak of $V_x$, while $V_3$ remains at level 0. Correspondingly, Z and $V_4$ also remain at a low level and the lamp 28 is out.

It is now assumed that, between the instants $t_4$ and $t_5$, an anomaly occurs in the ignition system, for example dirtying of the spark plug which is to generate the spark at $t_5$. In this situation, the peak of $V_x$ at the instant $t_5$ has a smaller amplitude and does not exceed the threshold $S_2$. Consequently, both $V_2$ and $V_3$ remain at a low level and Z instead presents a series of pulses each of which corresponds to a peak of $V_x$. The integrating circuit constituted by $R_{13}$, $R_{15}$ and $C_3$ supplies the input of $A_4$ with the signal $V_Z$ the course of which is illustrated in the penultimate graph at the bottom of FIG. 12. This signal represents the integration of the pulses of the signal Z with time, and hence increases in level at each pulse of these signals. In FIG. 12 it is assumed that, for example, at the third consecutive pulse (instant $t_8$) the signal $V_Z'$ already exceeds the threshold level $S_4$ established by the potentiometer $P_5$. Hence, at this instant, the signal $V_4$ output by the comparator $A_4$ changes to a high level and causes the lamp 28 to light up.

With reference to FIG. 12, it is now be assumed that the anomalous operation loses a certain number of ignitions until the normal situation is restored at $t_{12}$. The signal $V_4$ output by $A_4$ in any case remains for a certain period of time (for example, ten seconds) at the high level, for example until $t_{13}$, as a result of the delaying action of the feedback network of $A_4$. At the time $t_{13}$, $V_4$ returns to level 0 and the lamp 28 goes out.

It is then assumed that normal operation continues up to the instant $t_{14}$. At this instant, it is supposed that an operating anomaly occurs such that the ignition subsequent to the instant $t_{15}$ occurs with a peak of $V_x$ which also exceeds the threshold $S_3$. Starting from $t_{15}$, $V_1$, $V_2$ and $V_3$ have pulses in correspondence with each peak of $V_x$. Consequently, Z also has a pulse in correspondence with each peak of $V_x$ and the signal $V_Z'$ starts to rise until it exceeds the threshold $S_4$ at the instant $t_{18}$. At this instant, the output $A_4$ returns to the high level, causing the lamp 28 to light up again.

If, at a subsequent instant $t_{22}$, the operating anomaly stops, then the signal $V_Z'$ returns to zero at this instant. Slightly later, at the instant $t_{23}$, the signal $V_4$ also returns to a low level and the lamp 28 goes out.

Figure 10:
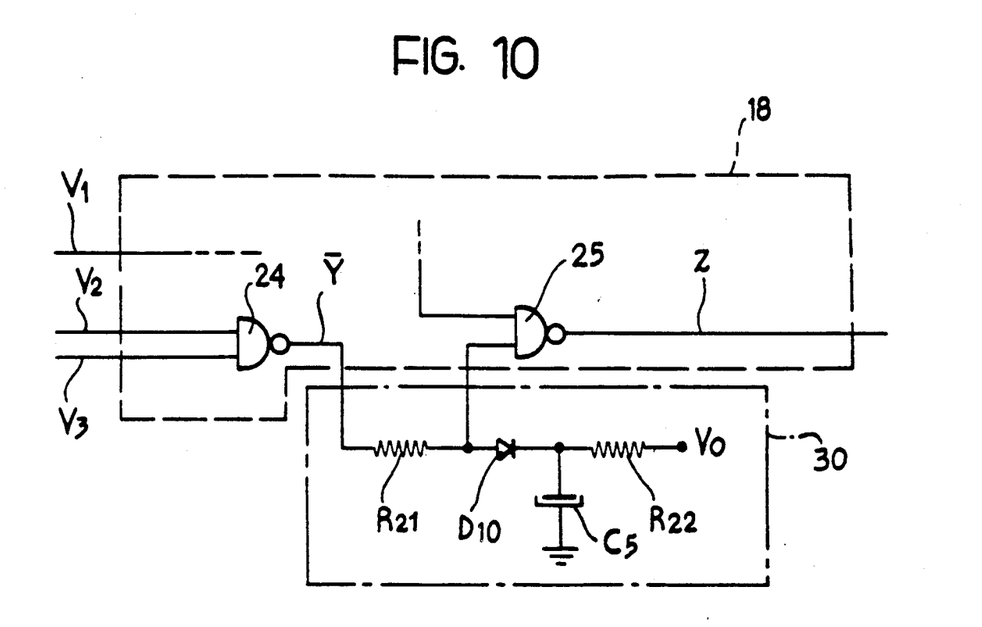

In order to allow checking of whether or not the lamp 28 is operational each time the electrical system of the motor vehicle is activated by means of the turning of the ignition key, the logic circuit 18 shown in FIG. 7 may be modified, as shown in FIG. 10, by the addition of a test circuit between the gates 24 and 25. This circuit includes a resistor $R_{21}$ connected between the output of the gate 24 and an input of the gate 25, and a capacitor $C_5$. This capacitor is connected on the one hand to earth and on the other hand is connected to the input of the gate 25 through a diode $D_{10}$ and to the stabilised voltage supply $V_0$ through a resistor $R_{22}$. The resistors $R_{21}$ and $R_{22}$ may have resistances, for example, of 220 k$\Omega$ and the capacitor $C_5$ may have a capacity, for example, of 1 $\mu$F.

Each time the circuit of FIG. 1 is connected to the electrical supply, the circuit 30 causes the appearance at the output of the logic circuit 18 of a single pulse of predetermined duration, for example 100 ms, arranged to saturate the input of the integrator of the circuit 26 at a high level. The amplifier $A_4$ of the integrating-monitoring circuit 26 is then forced to switch to the high level and hence pilots the switching on of the indicating lamp, enabling it to be checked that it is operational.

The method and the device according to the invention can be used not only in connection with ignition systems of the high-voltage mechanical distribution type but also with ignition systems of the static type. In this case, it is necessary solely to provide as many pick-up rings 10 as there are cylinders in the engine.

The method and the device according to the invention enable the operation of the high-voltage part of the ignition system to be kept under constant check, instant by instant. This is achieved by the use of an extremely simple and cheap pick up arranged to detect the high-voltage peaks provided to the spark plugs.

With regard to the method of the invention, it is convenient to stress that it may be carried out even by means of a circuit including a microprocessor unit. This solution may be particularly convenient in cases in which the internal combustion engine has a microprocessor system for controlling the ignition and/or the injection.

We claim:

1. An apparatus for detecting and indicating anomalies in the operation of the ignition system of an internal combustion engine, the system including a periodic high-voltage pulse in operation from an output of high-voltage generator means;

the apparatus including;

an indicator device arranged to provide a perceptible signal when activated, monitoring means coupled to the high-voltage generator means and arranged to output pulses having an amplitude proportional to the pulse generated by the generator means, and processing and comparison circuit means for comparing the peak values of the pulses output by the monitoring means with first and second predetermined threshold values, and for activating the indicator device when the peak values of the pulses generated by the monitoring means fall outside the acceptable range defined between the reference values;

wherein the processing and comparison means include a reference signal generator circuit for generating first and second reference signals, at least one first threshold comparator circuit and one second threshold comparator circuit for comparing the signals output by the monitoring means with the first and second reference signals, logic circuit means coupled to the first and second threshold comparators and arranged to output pulsed signals when the peak amplitude of the pulses generated by the monitoring means is less than the level of the first reference signal or above the level of the second reference signal, an integrating circuit connected to the output of the logic circuit means, a further threshold comparator circuit connected to the integrating circuit and arranged to output an activation signal to the indicator device each time the signal output by the integrating circuit exceeds a predetermined reference level, and timing means associated with the further threshold comparator circuit and arranged to extend the signal for activating the indicator device for a predetermined period of time with respect to the instant at which the signal output by the integrating circuit falls below the predetermined level.

* * * * *